(12) United States Patent
Feng

(10) Patent No.: US 12,713,581 B2
(45) Date of Patent: Aug. 18, 2026

(54) SEMICONDUCTOR DEVICE AND METHOD OF FORMING THE SAME

(71) Applicant: Fujian Jinhua Integrated Circuit Co., Ltd., Quanzhou City (CN)

(72) Inventor: Li-Wei Feng, Quanzhou City (CN)

(73) Assignee: Fujian Jinhua Integrated Circuit Co., Ltd., Quanzhou City (CN)

(*) Notice: Subject to any disclaimer, the term of this patent is extended or adjusted under 35 U.S.C. 154(b) by 365 days.

(21) Appl. No.: 18/237,391

(22) Filed: Aug. 23, 2023

(65) Prior Publication Data

US 2024/0422958 A1 Dec. 19, 2024

(30) Foreign Application Priority Data

Jun. 13, 2023 (CN) ........................ 202310693939.X
Jun. 13, 2023 (CN) ........................ 202321492569.5

(51) Int. Cl.
*H10B 12/00* (2023.01)

(52) U.S. Cl.
CPC ......... *H10B 12/315* (2023.02); *H10B 12/033* (2023.02); *H10B 12/09* (2023.02); *H10B 12/34* (2023.02); *H10B 12/50* (2023.02)

(58) Field of Classification Search
CPC .... H10B 12/315; H10B 12/033; H10B 12/09; H10B 12/34; H10B 12/50
See application file for complete search history.

(56) References Cited

U.S. PATENT DOCUMENTS 8,912,629 B2 * 12/2014 Seo ...................... H10B 12/033 257/532
9,449,977 B2 9/2016 Seo
9,659,940 B2 5/2017 Park
10,347,641 B2 7/2019 Kim
10,468,415 B2 11/2019 You
11,302,698 B2 4/2022 Choi
11,411,075 B2 8/2022 Cho
11,563,017 B2 1/2023 Kim
2013/0228837 A1 * 9/2013 Sukekawa ............. H10B 12/31 257/532
2018/0308923 A1 * 10/2018 Wu ........................ H10D 1/042
(Continued)

FOREIGN PATENT DOCUMENTS

CN 112331650 A 2/2021

*Primary Examiner* — Mohsen Ahmadi
(74) *Attorney, Agent, or Firm* — Winston Hsu

(57) ABSTRACT

A semiconductor device which includes a substrate, storage node pads, a capacitor structure and a supporting structure, and a forming method thereof are disclosed. The substrate includes a cell region and a periphery region. The storage node pads are disposed on the substrate and located in the cell region. The capacitor structure is disposed on the storage node pads and includes bottom electrodes in contact with the storage node pads. The supporting structure is disposed on the storage node pads and interleaved among the bottom electrodes. The supporting structure includes a first supporting layer and a second supporting layer sequentially from bottom to top. The second supporting layer includes a first thickness and a second thickness, wherein the second thickness is greater than the first thickness, and the second supporting layer with the second thickness is disposed between the cell region and the periphery region to provide improved structural support.

20 Claims, 11 Drawing Sheets

(56) References Cited

U.S. PATENT DOCUMENTS

| | | | | |
|---|---|---|---|---|
| 2019/0148382 | A1* | 5/2019 | Liu | H10B 12/033 257/532 |
| 2020/0152584 | A1 | 5/2020 | Sohn | |
| 2022/0139922 | A1 | 5/2022 | Jhan | |
| 2023/0034533 | A1* | 2/2023 | Lee | H10B 12/315 |
| 2023/0180472 | A1* | 6/2023 | Kim | H10B 41/46 257/314 |
| 2023/0262959 | A1* | 8/2023 | Park | H10B 53/30 257/296 |
| 2023/0284440 | A1* | 9/2023 | Shih | H10B 12/50 257/288 |
| 2024/0206153 | A1* | 6/2024 | Wu | H10B 12/315 |

* cited by examiner 10
290b(290)
296
298
264b
278b
264a
278c
140
152
150
148
146
144
142
112
100b
306
260
264b
(264)
262
286
154b
110
100
154a
154
156
304
100a
136
120
302
292
294
290a(290)
280
278b
278c
278a
278
284
282
264a
(264)
262
260
134
132
130
128
126
124
122

20
100a
100b
160a
R1
t11
t12
168b(168)
168c(168)
168a
(168)
166
164
162
152
140
150
148
146
144
142
112
110
100
154b
154a
154
156
136
120
134
132
128
126
124
122
160
130

40
290b(290)
296
298
306
100b
100a
286
260
364b
(364)
262
152
150
148
146
144
142
140
112
110
100
154b
154a
154
156
278b
364b
278c
364a
t13
t14
136
120
580
278
278b
278c
278a
582
584
364a
(364)
262
260
134
132
130
128
126
124
122
120

SEMICONDUCTOR DEVICE AND METHOD OF FORMING THE SAME

BACKGROUND OF THE INVENTION

1. Field of the Invention

The present invention generally relates to a semiconductor device and a method of forming the same, and more particularly, to a semiconductor memory device and a method of forming the same.

2. Description of the Prior Art

With the trend of miniaturization of various electronic products, the design of semiconductor devices must also meet the requirements of high integration and high density. Under the current mainstream of development trend, dynamic random access memories (DRAMs) having recessed gate structures have gradually replaced the DRAMs having only planar gate structures due to longer carrier channel length for the same semiconductor substrate so as to reduce current leakage of capacitor structures. In general, a dynamic random access memory having a recessed gate structure is implemented with an array area formed by a large number of memory cells, which are used to store information, and each memory cell may be composed of transistor components and capacitor components in series to receive voltage information from word lines (WL) and bit lines (BL). With higher and higher requirements on products, the density of memory cells in the array area has to continuously increase, resulting in increasing difficulty and complexity in related manufacturing processes and designs. Therefore, the existing technologies or structures need to be further improved to effectively improve the efficiency and reliability of related memory devices.

SUMMARY OF THE INVENTION

An object of the present invention is to provide a semiconductor device and a method of forming the same, in which a supporting structure formed between a cell region and a periphery region, has a localized larger thickness, thereby providing improved structural support for a capacitor structure.

In order to achieve the above object, an embodiment of the present invention provides a semiconductor device, which includes a substrate, storage node pads, a capacitor structure and a supporting structure. The substrate includes a cell region and a periphery region. The storage node pads are disposed on the substrate and located in the cell region. The capacitor structure is disposed on the storage node pads and includes a plurality of bottom electrodes in contact with the storage node pads, respectively. The supporting structure is disposed on the storage node pads and interleaved among the bottom electrodes while being in physical contact with the bottom electrodes. The supporting structure includes a first supporting layer and a second supporting layer sequentially from bottom to top, and the second supporting layer includes a first thickness and a second thickness, wherein the second thickness is greater than the first thickness, the second supporting layer with the first thickness is disposed in the cell region and the second supporting layer with the second thickness is disposed between the cell region and the periphery region.

In order to achieve the above object, an embodiment of the present invention provides a method of forming a semiconductor device, which includes the following steps. First of all, a substrate is provided. The substrate includes a cell region and a periphery region. A plurality of storage node pads are formed on the substrate and located in the cell region. A capacitor structure is formed on the plurality of storage node pads. The capacitor structure includes a plurality of bottom electrodes in contact with the plurality of storage node pads, respectively. A supporting structure is formed on the plurality of storage node pads, which are interleaved among the bottom electrodes while being in physical contact with the bottom electrodes. The supporting structure includes a first supporting layer and a second supporting layer sequentially from bottom to top. The second supporting layer includes a first thickness and a second thickness, wherein the second thickness is greater than the first thickness, the second supporting layer with the first thickness is disposed in the cell region and the second supporting layer with the second thickness is disposed between the cell region and the periphery region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 6 are schematic diagrams illustrating a forming method of a semiconductor device according to a first embodiment in the present disclosure, wherein:

FIG. 1 is a cross-sectional view of a semiconductor device after a process of forming a stack layer;

FIG. 2 is a cross-sectional view of a semiconductor device after a process of patterning a mask layer;

FIG. 3 is a cross-sectional view of a semiconductor device after a process of forming through holes;

FIG. 4 is a cross-sectional view of a semiconductor device after a process of forming mask patterns;

FIG. 5 is a cross-sectional view of a semiconductor device after a process of forming bottom electrodes; and FIG. 6 is a cross-sectional view of a semiconductor device after a process of forming a capacitor structure and contacts.

FIG. 7 to FIG. 8 are schematic diagrams illustrating a forming method of a semiconductor device according to a second embodiment in the present disclosure, wherein:

FIG. 7 is a cross-sectional view of a semiconductor device after a process of forming through holes; and FIG. 8 is a cross-sectional view of a semiconductor device after a process of forming a capacitor structure and contacts.

FIG. 9 to FIG. 10 are schematic diagrams illustrating a forming method of a semiconductor device according to a third embodiment in the present disclosure, wherein:

FIG. 9 is a cross-sectional view of a semiconductor device after a process of forming mask patterns; and FIG. 10 is a cross-sectional view of a semiconductor device after a process of forming a capacitor structure and contacts.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
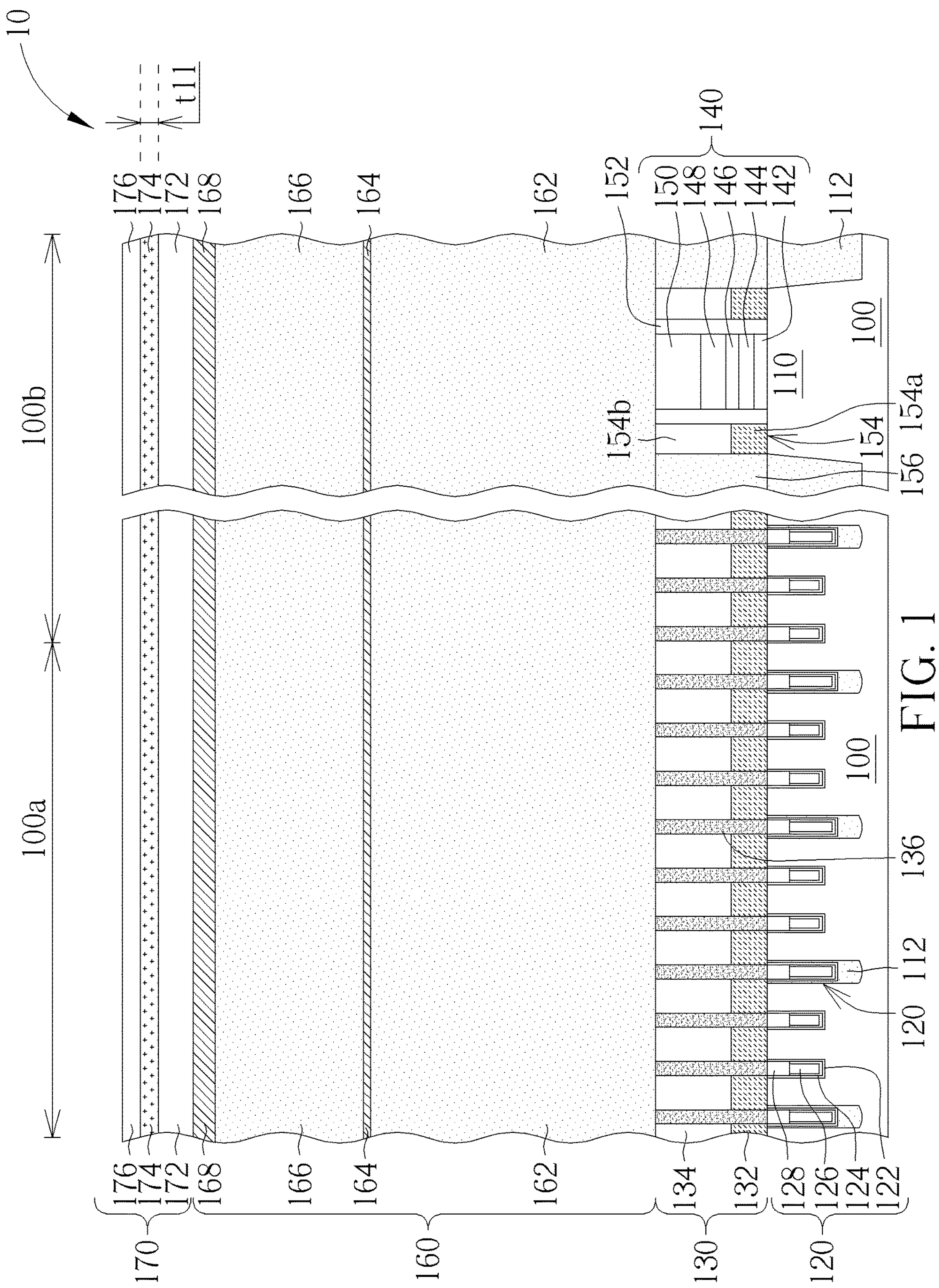

Please refer to FIG. 1 to FIG. 6, which are schematic diagrams illustrating steps of a forming method of a semiconductor device 10 according to a first embodiment of the present invention. First, as shown in FIG. 1, a substrate 100, e.g., a silicon substrate, a silicon-containing substrate (such as SiC, SiGe, etc.) or a silicon-on-insulator (SOI) substrate, is provided. The substrate 100 includes a region with a relatively high component integration, e.g., a cell region 100*a*, and another region with a relatively low component integration, e.g., a periphery region 100*b*. The cell region 100*a* and the periphery region 100*b* are arranged adjacent to each other, for example. Preferably, in a top view (not shown), the periphery region 100*b* surrounds the cell region 100*a*, but it is not limited thereto.

At least one isolation region, such as a shallow trench isolation (STI) 112, is formed in the substrate 100, and a plurality of active areas (AA) 110 are defined in the substrate 100, in a manner that the shallow trench isolation 112 surrounds all the active areas 110 from a top view. In one embodiment, the shallow trench isolation 112 is formed by, for example, forming a plurality of trenches (not shown) in the substrate 100 through etching, and then filling at least one insulating material, e.g., silicon oxide or silicon oxynitride, in the trenches to form the shallow trench isolation 112 with a surface flush with a top surface of the substrate 100, but is not limited thereto.

Next, a plurality of gates, preferably buried gates 120, are formed in the substrate 100. The buried gates 120 are formed in the cell region 100*a* in principle, and preferably formed in the cell region 100*a* and a part of the periphery region 100*b* adjacent to the cell region 100*a* in the present embodiment, as shown in FIG. 1. The formation of the buried gates 120 includes but is not limited to, the following steps. First, a plurality of trenches (not shown) extending in parallel with each other are formed in the substrate 100. Then, a dielectric layer 122 covering the entire surface of each trench, a gate dielectric layer 124 covering the lower half surface of each trench, a gate electrode 126 filling the lower half of each trench and a cap layer 128 filling the upper half of each trench are formed in each trench. In this way, the surface of the cap layer 128 can be aligned with the top surface of the substrate 100 so that the buried gates 120 located in the substrate 100 can be used as buried word lines (BWL) of the semiconductor device 10.

Then, a plurality of bit lines (BL) and a plurality of storage node contacts (SNC) 132 are formed on the substrate 100. In this embodiment, the bit lines and the storage node contacts 132 are also preferably formed in the cell region 100*a* and a part of the periphery region 100*b* adjacent to the cell region 100*a*. Although the bit lines are not specifically depicted in the drawings of this embodiment, those of ordinary skill in the art can easily understand that each bit line extends in parallel with each other, and is electrically isolated from the buried gates 120 located in the substrate 100 by an insulating layer (not shown, for example, including a silicon oxide-silicon nitride-silicon oxide structure) covering the top surface of the substrate 100. Each bit line extends into the active area 110 to be electrically connected to the substrate 100 through the bit line contacts (not shown, BLC) correspondingly formed under the bit line. It can also be easily understood by those of ordinary skill in the art that the extending directions of the active areas 110, the buried gates 120 and the bit lines are different from one another when viewed from the top view, wherein the extending direction of the bit lines should be perpendicular to the extending direction of the buried gate 120 to intersect with the active areas 110 and the buried gates 120 concurrently, and each storage node contact 132 is arranged between the bit lines.

The storage node contacts 132 are in physical contact with the active areas 110, and storage node pads 134 are respectively arranged thereabove. The adjacent storage node contacts 132 and adjacent storage node pads 134 are isolated from each other by a storage node contact isolation (SCISO) 136 arranged directly above the buried gates 120. In this way, the storage node contacts 132 can be electrically connected to the substrate 100 to receive and to transmit voltage signals from the substrate 100, e.g., transistors in the substrate 100. In an embodiment, the storage node contacts 132 include, for example, epitaxial material such as silicon (Si), silicon phosphorus (SiP), silicon germanium (SiGe) or germanium (Ge), and the storage node pads 134 include, for example, a low-resistance metal material such as aluminum (Al), titanium (Ti), copper (Cu) or tungsten (W). It is not limited thereto. It could be easily understood by those of ordinary skill in the art that the storage node pads 134 and the storage node contacts 132 may be monolithic optionally to include the same conductive material, but it is not limited thereto.

On the other hand, at least one gate structure 140 and a plurality of contacts 154 are formed on the substrate 100 in the periphery region 100*b*. It should be noted that a formation of the gate structure 140 is for example integrated into the process of forming the bit lines, so that the gate structure 140 has a structure and material similar to that of the bit lines, forming example including a gate dielectric layer 142 (including the same material as the insulating layer, e.g., a silicon oxide-silicon nitride-silicon oxide structure), a semiconductor layer 144 (e.g., including polysilicon), a barrier layer 146 (e.g., including titanium and/or titanium nitride), a conductive layer 148 (e.g., including a metal with a low resistance metal such as tungsten, aluminum or copper) and a cap layer 150 (e.g., including silicon oxide, silicon nitride or silicon oxynitride, etc.) stacked on the top surface of the substrate 100 in sequence. Then, a spacer 152 disposed on sidewalls of the at least one gate structure 140 is formed together with bit line spacers (not shown) disposed on sidewalls of the bit lines to include the same material, but it is not limited thereto. In addition, the formations of the contacts 154 are for example integrated into the forming process of the storage node contacts 132 and the storage node pads 134, so that each contact 154 includes an epitaxial material 154*a* (including, for example, silicon, silicon phosphorus, silicon germanium or germanium) and a low-resistance metal material 154*b* (including, for example, aluminum, titanium, copper or tungsten) stacked in sequence. The contacts 154 are formed in a dielectric layers 156 at two opposite sides of the gate structure 140 and electrically connected to the substrate 100.

As shown in FIG. 1, a supporting layer structure 160 and a mask layer structure 170 are then formed on the substrate 100, wherein both the supporting layer structure 160 and the mask layer structure 170 cover entirely the cell region 100*a* and the periphery region 100*b* of the substrate 100. In detail, the supporting layer structure 160 includes, for example, at least one oxide layer and at least one nitride layer alternately stacked with each other. In this embodiment, the supporting layer structure 160 includes, for example, a first supporting material layer 162 (including, for example, silicon oxide), a second supporting material layer 164 (including, for example, silicon nitride or silicon carbonitride), a third supporting material layer 166 (including, for example, silicon oxide), and a fourth supporting material layer 168 (including, for example, silicon nitride or silicon carbonitride), etc., which are sequentially stacked from bottom to top, but it is not limited thereto. Preferably, the first support material layer 162 or the third support material layer 166, for example, being an oxide layer, may have a larger thickness, for example, about 5 times to more than 10 times greater than a thickness of the second support material layer 164 or the fourth support material layer 168, for example, being a nitride layer. Furthermore, a thickness t11 of the nitride layer located relatively away from the substrate 100, e.g., the fourth support material layer 168, is preferably greater than a thickness of the nitride layer located relatively close to the substrate 100, e.g., the second support material layer 164, as shown in FIG. 1, but it is not limited thereto. In this way, the overall thickness of the supporting layer structure 160 reaches about 1600 angstroms to about 2000 angstroms, but it is not limited thereto. It should be understood by those of ordinary skill in the art that the number of stacks of oxide and nitride layers is not limited to that illustrated in FIG. 1, but can be adjusted according to practical requirements. The mask layer structure 170 is formed on the supporting layer structure 160 and preferably has a composite structure. In this embodiment, the mask layer structure 170 includes, for example, an organic bottom layer 172, a Si-containing bottom anti-reflective coating (Si-BARC) 174, and a photoresist layer 176, etc. stacked in sequence, but it is not limited thereto.

Figure 2:
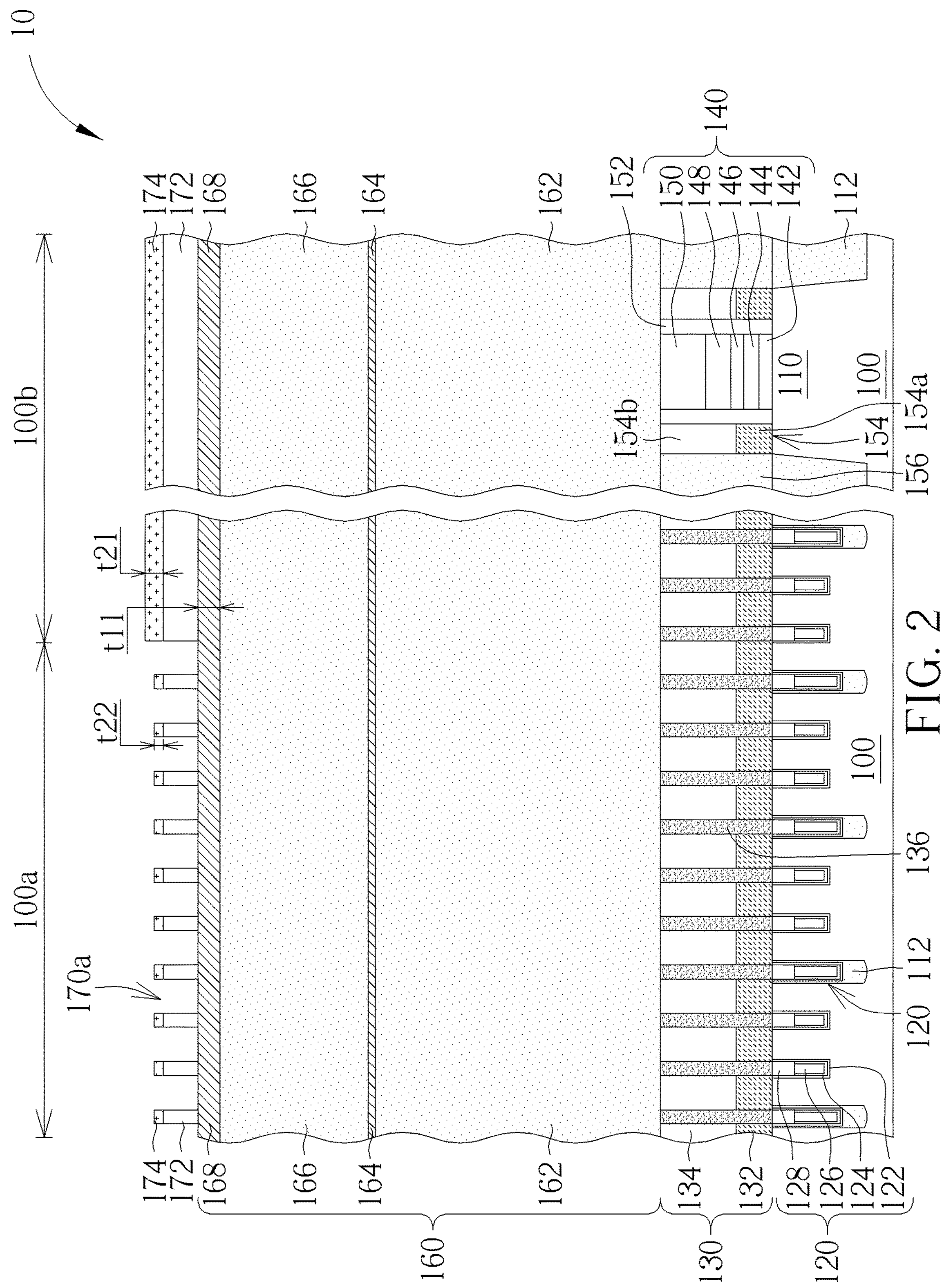

As shown in FIG. 2, a photolithography process is performed. The photolithography process includes, but is not limited to, the following steps. First, a photomask (not shown) is provided, and patterns of the photomask are transferred to the photoresist layer 176. Then the photoresist layer 176 as shown in FIG. 1 is patterned. Next, the patterned photoresist layer 176 is transferred to the Si-BARC layer 174 and the organic bottom layer 172 below to form the layers-BARC layer 174 and the organic bottom layer 172 as shown in FIG. 2. It should be noted that since the patterns of the photomask are mainly located in the cell region 100*a*, while the periphery region 100*b* is entirely covered by the mask layer structure 170, the difference in pattern integration between the two regions, i.e., the cell region 100*a* and the periphery region 100*b*, leads to a micro-loading effect. Therefore, in transferring the patterns, due to relatively large consumption of the local etching gas or uneven distribution of the etching gas, the Si-BRAC layer 174 in the cell region 100*a* has a reduced thickness t22 after the photolithography process, while the Si-BRAC layer 174 in the periphery region 100*b* maintains the original thickness t21 after the photolithography process. That is, after the photolithography process, the top surface of the Si-BRAC layer 174 located in the periphery region 100*b* and the top surface of the Si-BRAC layer 174 located in the cell region 100*a* are not coplanar with each other, as shown in FIG. 2.

Figure 3:
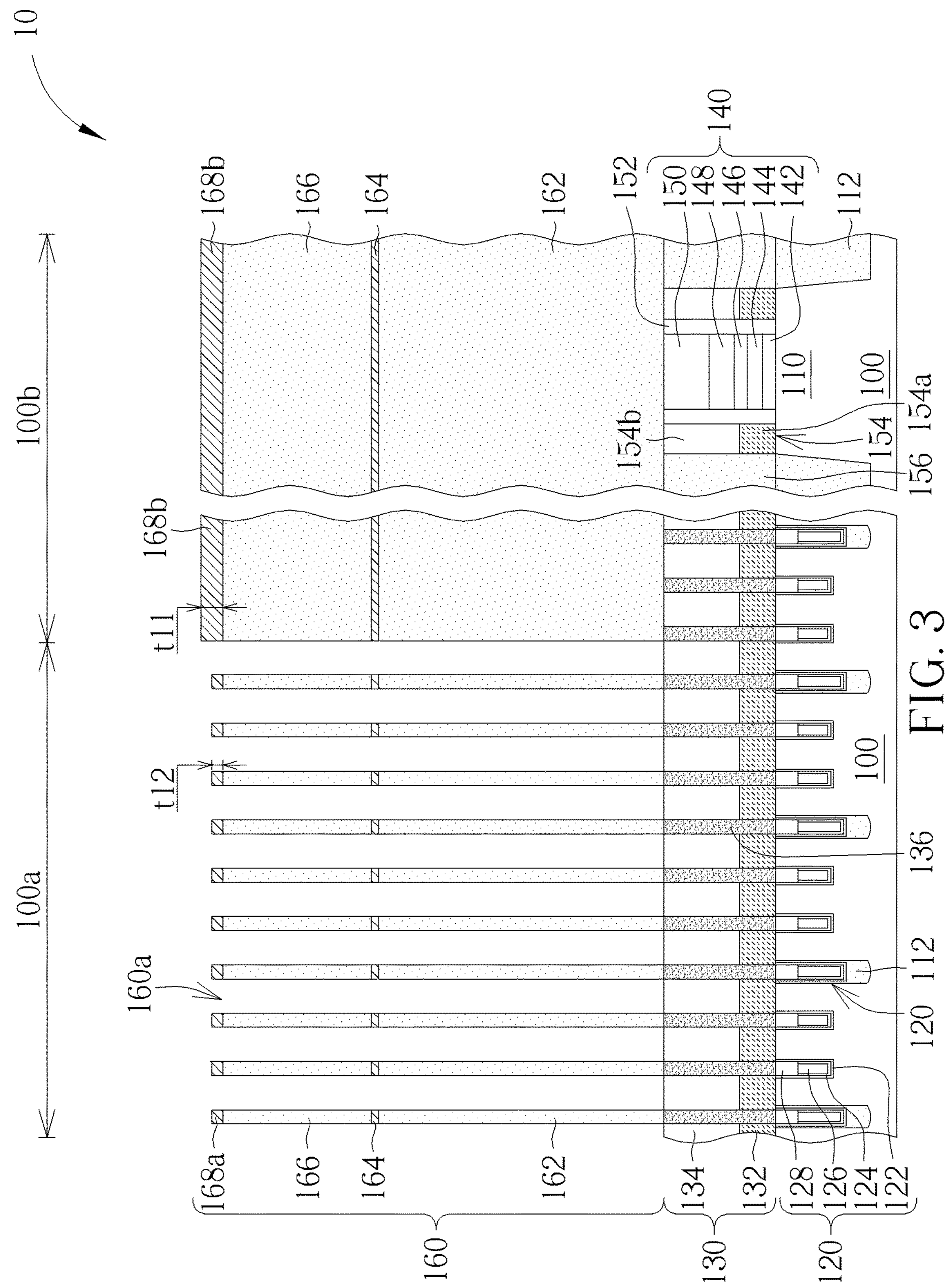

Afterwards, an etching process, e.g., a dry etching process, is performed through the Si-BRAC layer 174 and the organic bottom layer 172 as shown in FIG. 2. The fourth support material layer 168, the third support material layer 166, the second support material layer 164 and the first support material layer 162 are sequentially penetrated to form a plurality of through holes 160*a* in the supporting layer structure 160, as shown in FIG. 3. Each through hole 160*a* is aligned with a corresponding storage node pad 134 below, so that the top surface of the corresponding storage node pad 134 is exposed from the through hole 160*a*. The Si-BRAC layer 174 and the organic bottom layer 172 as shown in FIG. 2 are consumed synchronously during the etching process, or are completely removed after the etching process. It should also be noted that since the difference in the pattern density of the Si-BRAC layer 174 in the two regions, i.e., the cell region 100*a* and the periphery region 100*b*, leads to the micro-loading effect, the fourth support material layer 168*a* in the cell region 100*a* will be partially consumed during the etching process down to the reduced thickness t12. Meanwhile, the fourth support material layer 168*b* in the periphery region 100*b* will maintain the original thickness t11. That is, after the etching process, the top surface of the fourth support material layer 168*b* located in the periphery region 100*b* and the top surface of the fourth support material layer 168*a* located in the cell 100*a* are not coplanar with each other, as shown in FIG. 3.

Figure 4:
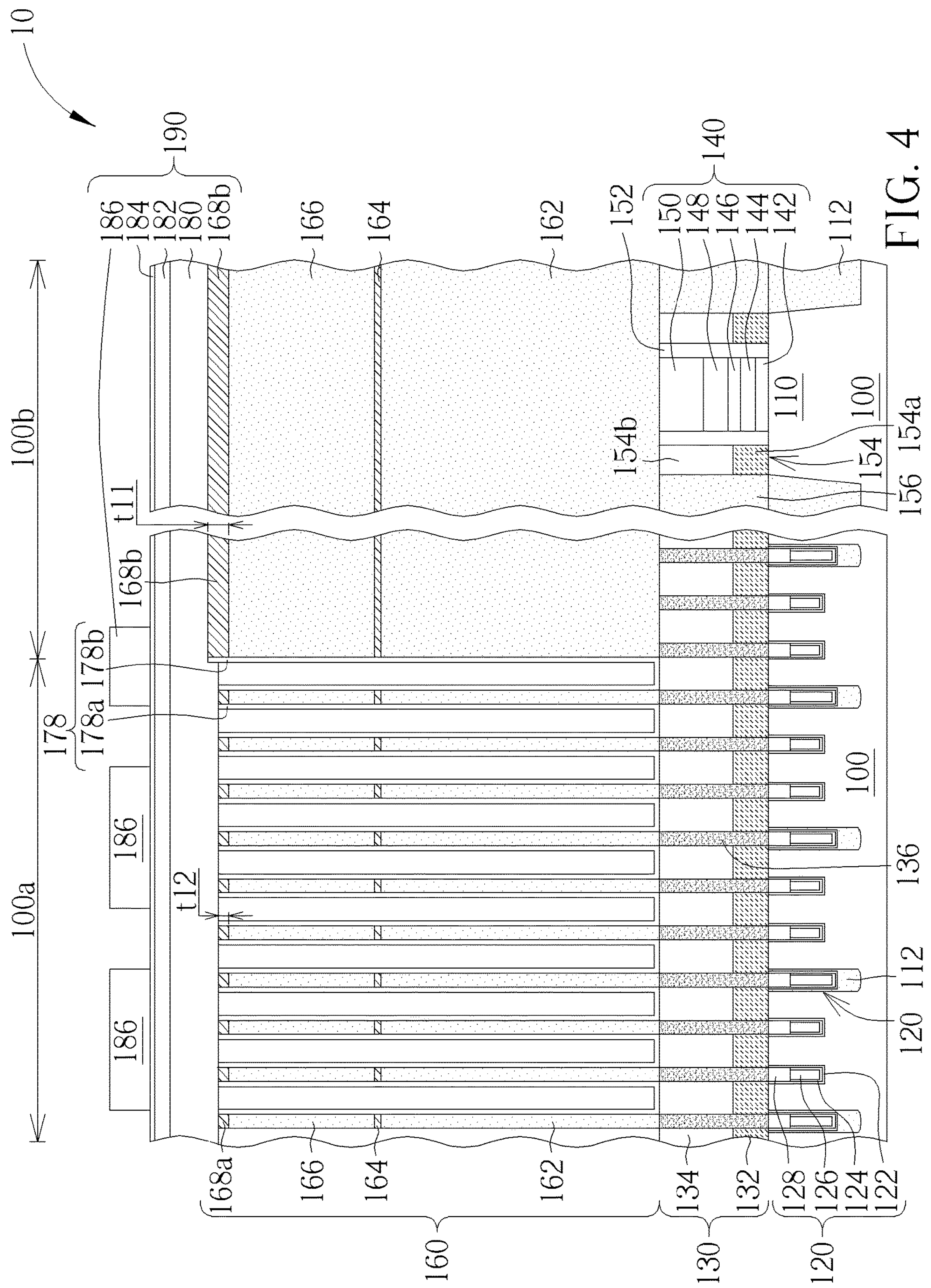

As shown in FIG. 4, a deposition and etch-back process is performed to form a plurality of bottom electrode layers 178 in the supporting layer structure 160, and a mask layer structure 190 is formed on the supporting layer structure 160 and the bottom electrode layers 178. In an embodiment, the process of forming the bottom electrode layer 178 includes but is not limited to the following steps. First, an electrode material layer for example including a low-resistance metal material such as aluminum, titanium, copper or tungsten, and preferably titanium is formed on the supporting layer structure 160. A part of the electrode material layer is formed in each through holes 160*a* and conformally covers the inner surface of each through hole 160*a*, while another part is formed outside the through holes 160*a* and covers the top surface of the supporting layer structure 160. Subsequently, the electrode material layers formed outside each through hole 160*a* are removed, and a plurality of bottom electrode layers 178 with a U-shaped electrode structure are formed in the through holes 160*a*. It should be noted that since a thickness difference (t12/t11) exists between the fourth support material layer 168*a* in the cell region 100*a* and the fourth support material layer 168*b* in the periphery region 100*b*, the bottom electrode layer 178*b* formed at the boundary between the cell region 100*a* and the periphery region 100*b* has two sidewalls with different heights. The sidewall of the bottom electrode layer 178*b* adjacent to the periphery region 100*b* has a top surface at a higher level, while the sidewall of the bottom electrode layer 178*b* adjacent to the cell region 100*a* has a top surface at a lower level, which is at the same level as the top surface of the fourth supporting material layer 168*a* in the cell region 100*a*, thus showing an asymmetric structure. The bottom electrode layer 178*a* formed in the cell region 100*a* has two sidewalls with the same height, and the two sidewalls are both at the same level as the fourth supporting material layer 168*a* in the cell region 100*a*, thus showing a symmetrical structure.

As shown in FIG. 4, the mask layer structure 190 also has a composite structure, for example including but not limited to an organic bottom layer 180, a Si-BRAC layer 182, a photoresist layer 184 and a plurality of mask patterns 186, which are stacked in sequence. The mask patterns 186 cover the supporting layer structure 160 in the cell region 100*a* in a manner of covering two adjacent bottom electrode layers 178*a* concurrently and partially covering one bottom electrode layer 178*a* at either side of the two adjacent bottom electrode layers 178*a*. In addition, one of the mask patterns 186 further covers a part of the cell region 100*a* and a part of the periphery region 100*b* concurrently, thereby completely covering the bottom electrode layer 178*b* formed at the boundary between the cell region 100*a* and the periphery region 100*b*.

Subsequently, at least one etching process, e.g., a first dry etching process, is performed on the supporting layer structure 160 through the mask patterns 186 shown in FIG. 4, and a part of the photoresist layer 184, a part of the Si-BRAC layer 182, a part of the organic bottom layer 180, a part of the fourth supporting material layer 168*a* and a part of the third supporting material layer 166 are removed. Then, a first wet etching process is performed. An etchant, e.g., tetramethylammonium hydroxide (TMAH), is introduced to remove the remaining third supporting material layer 166. Subsequently, another etching process, e.g., a second dry etching process, is performed to remove a part of the second supporting material layer 164 and a part of the first supporting material layer 162, and then a second wet etching process is performed to remove the remaining part of the first supporting material layer 162 by introducing an etchant, e.g., tetramethylammonium hydroxide. That is, the mask layer structure 190 and the supporting layer structure 160 formed in the periphery region 100*b* are completely removed. The remaining mask layer structure 190 is then completely removed.

Figure 5:
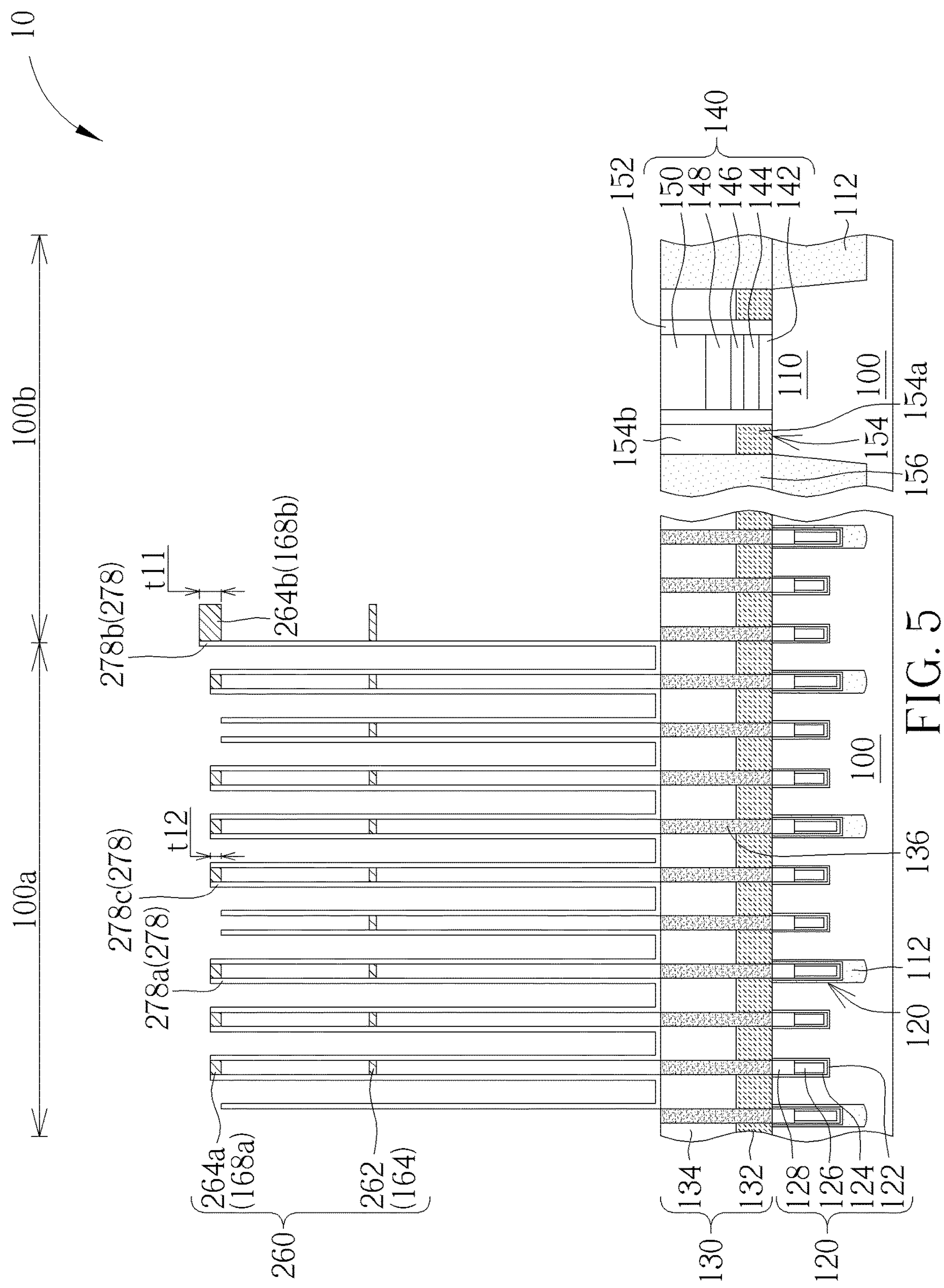

It should be noted that the mask patterns 186 shown in FIG. 4 and the bottom electrode layer 178*a* in the cell region 100*a* will be consumed synchronously during the first dry etching process and/or the first wet etching process, so as not only to remove the mask patterns 186 but also to lower a level of one of the sidewalls of the bottom electrode layer 178*a*. Under this operation, as shown in FIG. 5, a plurality of bottom electrodes 278 are formed on the storage node contacts 132, including bottom electrodes 278*a* with a symmetrical U-shaped electrode structure and disposed in the cell region 100*a*, bottom electrodes 278*b* with an asymmetrical U-shaped electrode structure and disposed at the boundary between the cell region 100*a* and the periphery region 100*b*, and bottom electrodes 278*c* with an asymmetrical U-shaped electrode structure and disposed in the cell region 100*a*. One of the sidewalls of each bottom electrode 278*b* is at the same level as the sidewalls of the bottom electrodes 278*a*, while another one of the sidewalls of each bottom electrode 278*b* is at a level higher than the sidewalls of the bottom electrodes 278*a*. One of the sidewalls of each bottom electrode 278*c* is also at the same level as the sidewalls of the bottom electrodes 278*a*, while another one of the sidewalls of each bottom electrode 278*c* is at a level lower than the sidewalls of the bottom electrodes 278*a*. Through this arrangement, a space between some of the bottom electrodes 278 can be additionally enlarged, e.g., between the bottom electrodes 278*a* and 278*c* in the cell 100*a*, thereby facilitating the subsequent deposition process.

On the other hand, the remaining fourth supporting material layer 168*a* and 168*b* and the remaining second support material layer 164 form a second supporting layer 264*a* and 264*b* and a first supporting layer 262, respectively, which are sequentially arranged from top to bottom and together form a supporting structure 260 arranged on the storage node pads 134. The supporting structure 260 is disposed between the bottom electrodes 278 and in physical contact with at least one of the sidewalls of each bottom electrode 278 to provide corresponding structural support. In detail, as shown in FIG. 5, the second support layer part 264*a* disposed in the cell region 100*a* has a relatively smaller first thickness t12, and its top surface is coplanar with the top surface of each bottom electrode 278*a* in the cell region 100*a*. The second support layer part 264*b* disposed in the periphery region 100*b* has a relatively larger second thickness t11, and the topmost surface of the second support layer part 264*b* is higher than the top surface of the second support layer 264*a* and coplanar with the top surface of the higher sidewall of the bottom electrodes 278*b*. The bottom surface of the second support layer part 264*b* is coplanar with the bottom surface of the second support layer 264*a*. That is, the height of the second support layer part 264*b* relative to the top surface of the substrate 100 is higher than the height of the second support layer part 264*a* relative to the top surface of the substrate 100. In this way, by disposing the second support layer part 264*b* can improve the structural support of the bottom electrodes 278*b* at the junction of the cell region 100*a* and the periphery region 100*b*.

Figure 6:
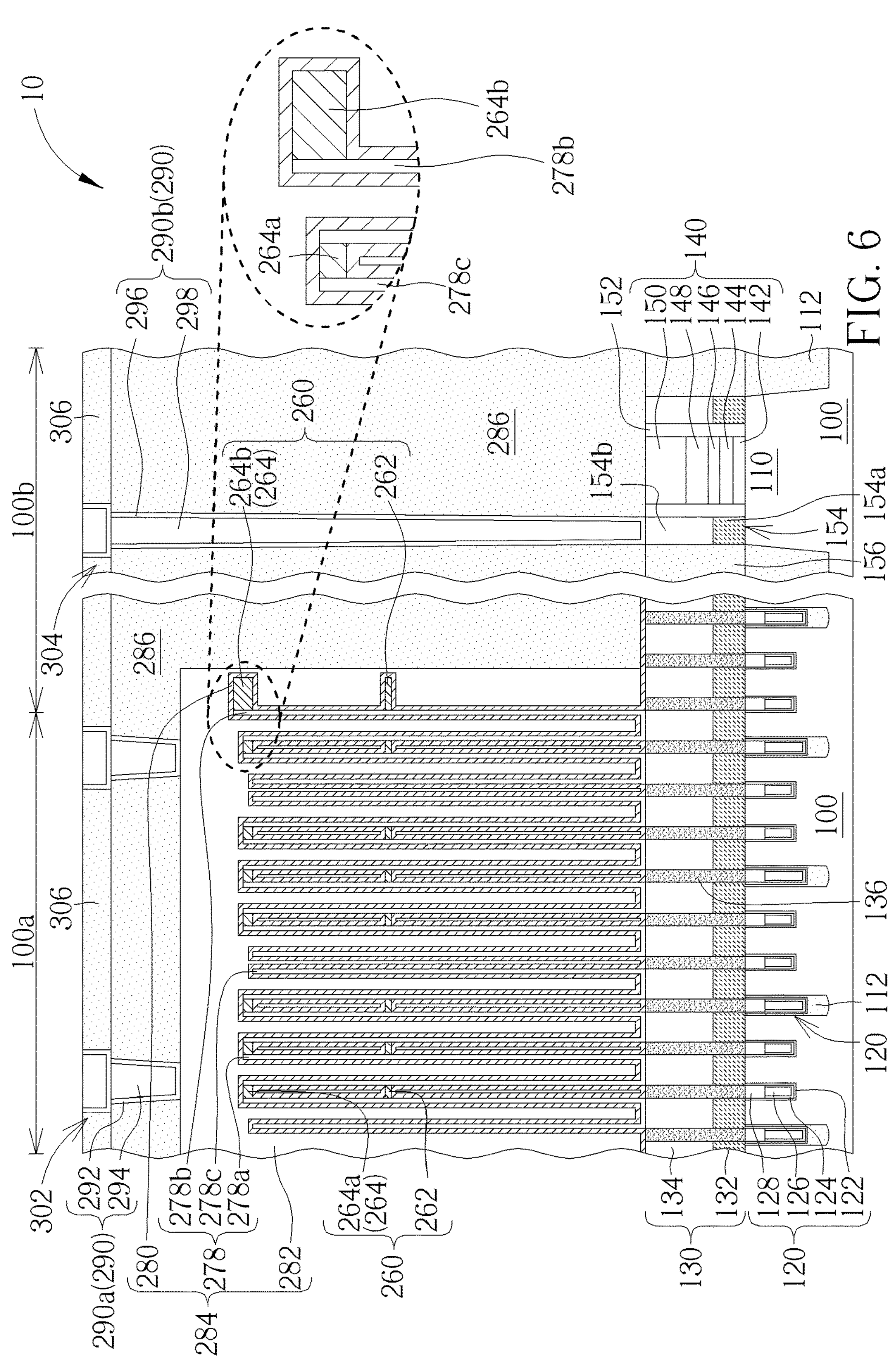

As shown in FIG. 6, at least one deposition process is performed on the supporting structure 260, and a capacitive dielectric layer 280 and a top electrode layer 282 are sequentially formed. The capacitive dielectric layer 280 conformally covers the exposed surfaces of the bottom electrodes 278 and the supporting structure 260. The top electrode layer 282 covers the capacitive dielectric layer 280 and fills the remaining space between the bottom electrodes 278. A part of the capacitive dielectric layer 280 and the top electrode layer 282 can be further formed in the space between the second supporting layer 264 and the first supporting layer 262 as well as the space between the first supporting layer 262 and the storage node pads 134, thereby increasing contact area and raising capacitance. In one embodiment, the capacitive dielectric layer 280 includes a dielectric material with a high dielectric constant, e.g., hafnium oxide ($HfO_2$), hafnium silicon oxide (HfSiO), hafnium silicon oxynitride (Hafnium silicon oxynitride), HfSiON), aluminum oxide ($Al_2O_3$), lanthanum oxide (LaO), lanthanum aluminum oxide (LaAlO), tantalum oxide ($Ta_2O_3$), titanium oxide ($TiO_2$), yttrium oxide ($Y_2O_3$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), Lead zirconate titanate ($PbZrxTi_{1-x}O_3$, PZT) or Barium Strontium Titanate ($BaxSr_{1-x}TiO_3$, BST), etc. and preferably comprises zirconia-alumina-zirconia (ZAZ). The top electrode layer 282 includes a low-resistance metal material such as aluminum, titanium, copper or tungsten, etc. and preferably includes, but not limited to, titanium.

Then, by performing a patterning process, the top electrode layer 282 and the capacitive dielectric layer 280 disposed outside the cell region 100*a* are removed to form a capacitor structure 284. The process of forming the capacitor structure 284 is completed accordingly. The capacitor structure 284 are formed with the bottom electrodes 278, the capacitive dielectric layer 280 and the top electrode layer 282 stacked in sequence, and includes a plurality of vertically extending capacitors as storage nodes (SN) of the semiconductor device 10, wherein each of the capacitors can be electrically connected to a transistor device (not shown) in the substrate 100 through one of the storage node contacts 132. Under this arrangement, the semiconductor device 10 in this embodiment can form a dynamic random access memory (DRAM) device which includes at least one transistor and at least one capacitor, thereto serve as the smallest unit in the DRAM array for accepting signals from the bit line and the buried word lines e.g., the buried gate 120.

Subsequently, as shown in FIG. 6, an interlayer dielectric layer 286 is formed on the substrate 100 to cover the capacitor structure 284 in the cell region 100*a* and the gate structure 140 in the periphery region 100*b*. At least one plug 290 electrically connected to the capacitor structure 284 and the gate structure 140 is formed in the interlayer dielectric layer 286. In detail, the plug or plugs 290*a* electrically connected to the capacitor structure 284 are formed in the cell region 100*a* and in physical contact with the capacitor structure 284. The plug or plugs 290*b* electrically connected to the gate structure 140 are formed in the periphery region 100*b* with a relatively large aspect ratio and in physical contact with one of the contacts 154. In an embodiment, each plug 290*a*, 290*b* includes a barrier layer 292, 296 and a conductive layer 294, 298 stacked in sequence, wherein the barrier layer 292, 296 includes a material such as titanium, tantalum, titanium nitride or tantalum nitride. The conductive layer 294, 298 includes a material such as aluminum, titanium, tantalum, tungsten, niobium, molybdenum, copper and the like, and preferably includes, but not limited to, tungsten.

As such, the forming method of the semiconductor device 10 in this embodiment is completed. Subsequently, the capacitor structure 284 formed in the cell region 100*a* and the gate structure 140 formed in the periphery region 100*b* can be further connected to external circuits through the plugs 290 and subsequently formed interconnection metal line. Those of ordinary skill in the art would readily understand that the specific wiring configuration and number of the interconnection metal lines can be adjusted according to the practical requirements of devices, for example, at least further comprising wires 302 and 304 electrically connecting the plugs 290*a* and 290*b* and a dielectric layer 306 surrounding the wires 302 and 304, as shown in FIG. 6, but it is not limited thereto.

According to the forming method of the semiconductor device 10 in the first embodiment of the present invention, a supporting structure 260 with a localized larger thickness is formed at the boundary between the cell region 100*a* and the periphery region 100*b*. For example, the second supporting layer 264*a* disposed in the cell region 100*a* has a first thickness t12, and the second supporting layer 264*b* disposed at the junction of the cell region 100*a* and the periphery region 100*b* has a second thickness t11 larger than the first thickness t12. Accordingly, when the bottom electrodes 278 are formed, each of the bottom electrodes 278*b* formed at the boundary between the cell region 100*a* and the periphery region 100*b* has two opposite sidewalls with top surfaces at different levels. The sidewall of each bottom electrodes 278*b* adjacent to the periphery region 100*b* is in physical contact with the second supporting layer part 264*b* and has the top surface at a higher level, while the opposite sidewall of each bottom electrodes 278*b* adjacent to the cell region 100*a* has the top surface at a lower level, which is the same as a level of the top surface of the second supporting layer part 264*a*, thereby presenting in an asymmetric structure as a whole. Under this operation, the forming method according to this embodiment of the present invention can enlarge the space between adjacent bottom electrodes 278 in the cell region 100*a* by forming the bottom electrodes 278 with a locally asymmetric structure, for example between the bottom electrodes 278*b* and 278*c*, so as to facilitate the subsequent deposition process. In addition, the forming method according to this embodiment of the present invention can strengthen the structural support of the bottom electrodes 278 at the junction of the cell region 100*a* and the periphery region 100*b* by forming the supporting structure 260 with relatively large local thickness. Furthermore, the subsequently formed capacitive dielectric layer 280 covers the second supporting layer part 264*b*, so that each sidewall and the top surface of the second supporting layer part 264*b* are in physical contact with the bottom electrode 278*b* or the capacitive dielectric layer 280, respectively. Accordingly, the contact area between the capacitive dielectric layer 280, the top electrode layer 282 and the second supporting layer part 264*b* are increased to enhance physical support. Therefore, the forming method of the semiconductor device 10 in this embodiment can effectively enhance the structural reliability of the semiconductor device 10 and improve the function and efficiency of the semiconductor device 10 as the density of memory cells is increasing and the complexity of the forming process is also increasing.

In the semiconductor device 10 according to the first embodiment of the present invention, a supporting structure 260 with a relatively localized larger thickness is arranged at the junction of the cell region 100*a* and the periphery region 100*b* to strengthen the structural support of the bottom electrodes 278 at the junction of t the cell region 100*a* and the periphery region 100*b*, and meanwhile, the contact area between the capacitive dielectric layer 280, the top electrode layer 282 and the second supporting layer 264*b* is increased to enhance physical support. Furthermore, the semiconductor device 10 in this embodiment is also provided with bottom electrodes 278 with a locally asymmetric structure, e.g., bottom electrodes 278*b* and 278*c*, so as to effectively enlarge the space between adjacent bottom electrodes 278 in the cell region 100*a*, and facilitate the subsequent deposition process. Therefore, the semiconductor device 10 in this embodiment can maintain the structural reliability of the semiconductor device 10 and achieve the improved function and efficiency on the premise of continuously increasing the density of memory cells.

It could be easily understood by those of ordinary skill in the art that the semiconductor device and the forming method thereof according to the present invention may have alternative forms not limited to the above, for meeting practical requirements of products. Hereinafter, other embodiments or variations of the semiconductor device and the forming method thereof according to the present invention will be further described. For simplification, the following descriptions are mainly focused on the differences between embodiments, and will not repeat the similarities. In addition, the same components in various embodiments of the present invention are labeled with the same reference numerals, so as to facilitate mutual comparison among various embodiments.

Figure 7:
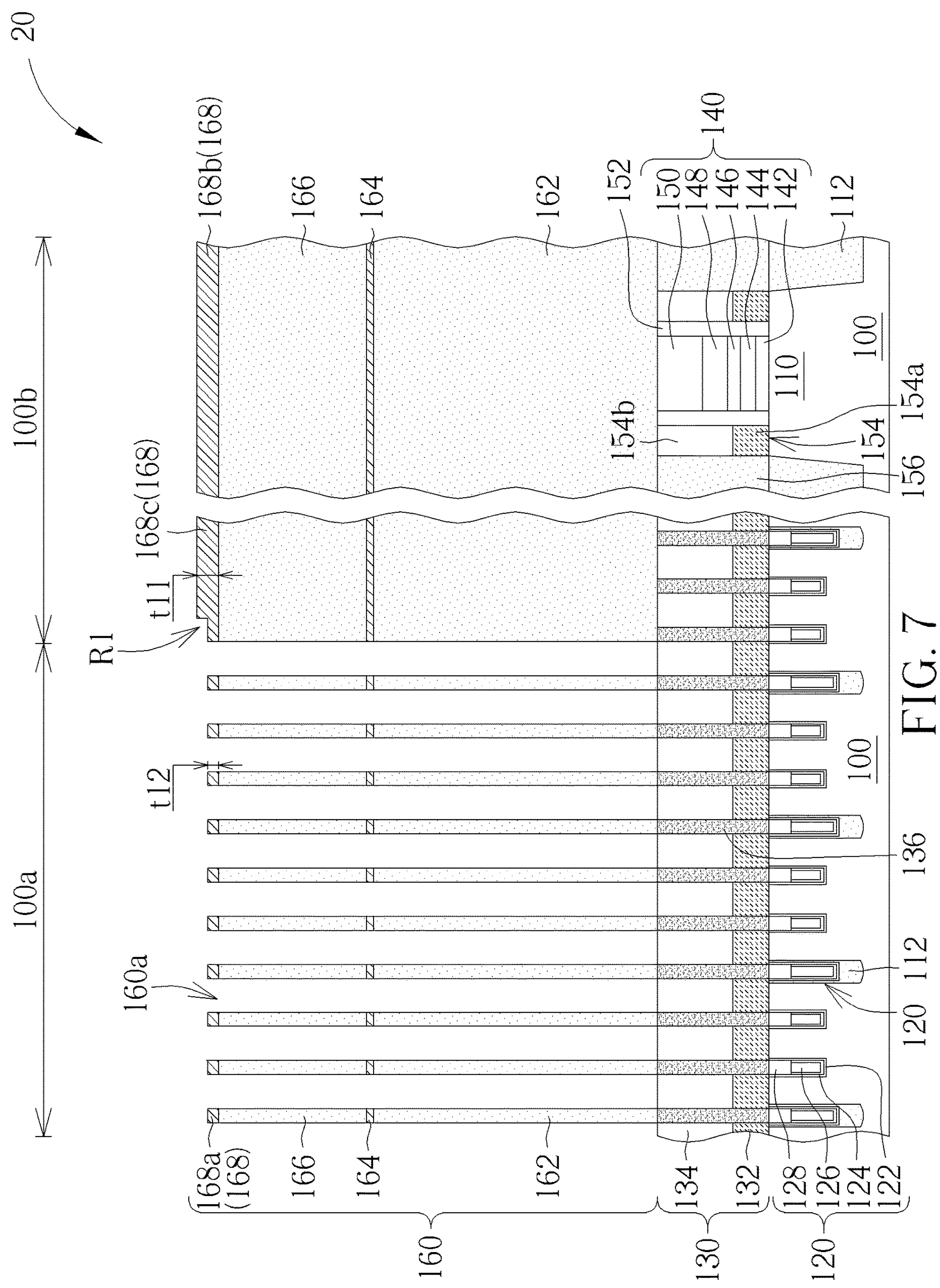
Figure 8:
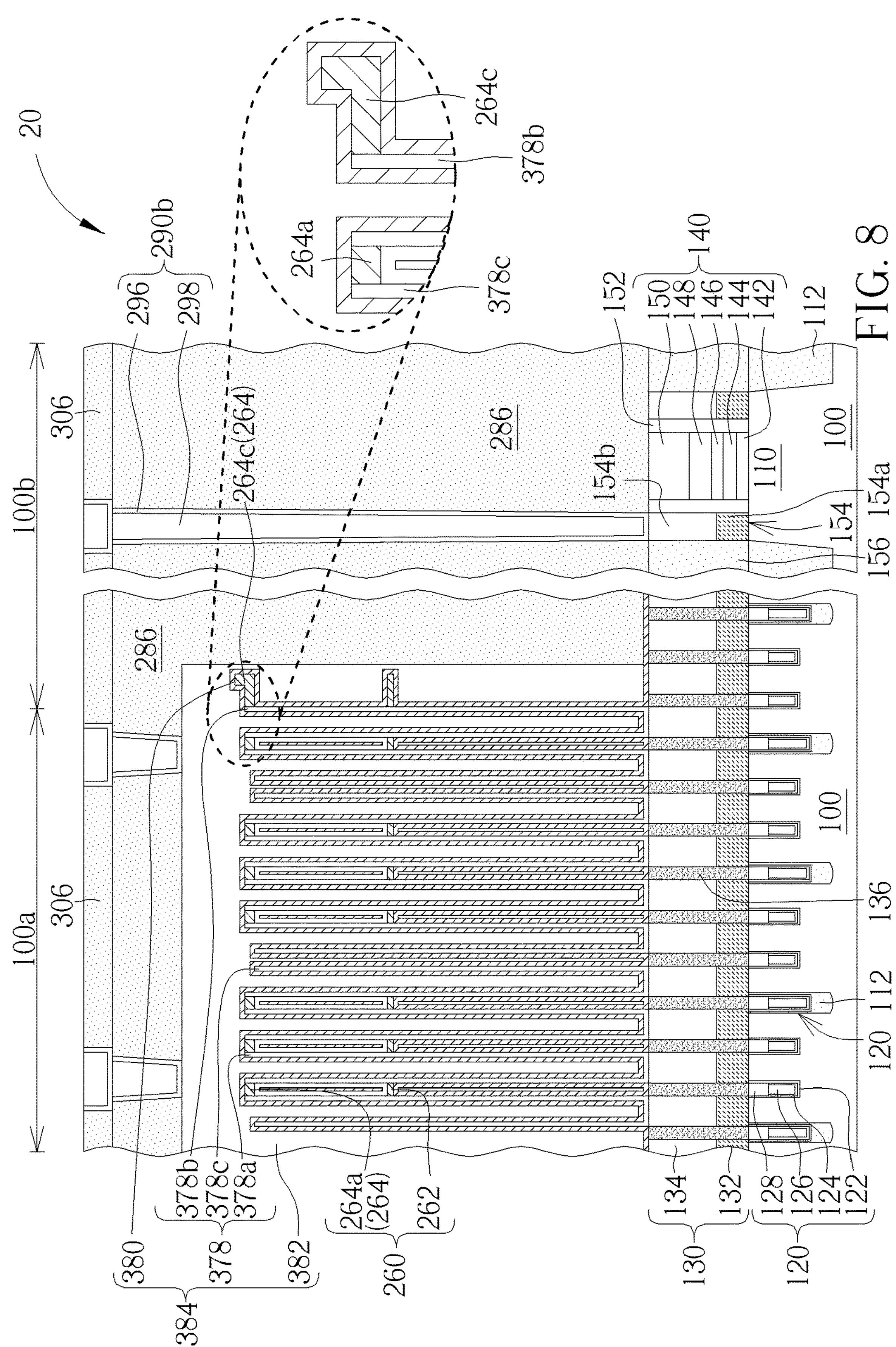

Please refer to FIG. 7 and FIG. 8, which schematically illustrate steps of the forming method of a semiconductor device 20 according to a second embodiment of the present invention. The steps of forming the semiconductor device 20 in this embodiment are basically the same as those of the forming method of the semiconductor device 10 in the first embodiment, and the similarities will not be described again. The main difference between the forming method in this embodiment and the forming method in the first embodiment is that the thickness t21 (as shown in FIG. 2) of the layers-BRAC 174 partially disposed in the periphery region 100*b* is also reduced during pattern transfer due to the aforementioned micro-loading effect, and the fourth supporting material layer part 168*b* under the Si-BRAC layer 174 is also partially etched during the subsequent etching process to form a fourth supporting material layer part 168*c* with a notch R1.

In detail, as shown in FIG. 7, in this embodiment, the fourth supporting material layer 168*a* formed in the cell region 100*a* will be partially consumed during the etching process, and accordingly has the same reduced thickness t12. The fourth supporting material layer part 168*b* disposed in the periphery region 100*b* is completely protected by the Si-BRAC layer 174, which has an original thickness t21, and the organic bottom layer 172 as shown in FIG. 2, so as to maintain the original thickness t11. Since the fourth support material layer part 168*c* disposed at the junction of the cell region 100*a* and the periphery region 100*b* is partially consumed during the etching process so that the part adjacent to the cell region 100*a* also has a reduced thickness t12, while the part adjacent to the periphery region 100*b* maintains the original thickness t11, the whole structure presents a stepped structure.

Then, as shown in FIG. 8, proceed to the steps of the process illustrated with reference to FIG. 4 to FIG. 6 in the first embodiment. Bottom electrodes 378, a supporting structure 260, a capacitive dielectric layer 380 and a top electrode layer 282 are formed in sequence, and a capacitor structure 384 in this embodiment is composed of the bottom electrodes 378, the capacitive dielectric layer 380 and the top electrode layer 282, which are stacked in sequence. It should be noted that the second supporting layer part 264*c* formed at the junction of the cell region 100*a* and the periphery region 100*b* partially has a relatively large second thickness t11 and partially has a relatively small first thickness t12, so that a portion of the bottom electrodes 378 formed at the junction of the cell region 100*a* and the periphery region 100*b*, e.g., bottom electrodes 378*b*, have opposite sidewalls at the same level, showing a symmetrical structure. In addition, both the sidewalls of the bottom electrodes 378*b* are at the same level as the sidewalls of another portion of the bottom electrode 378, e.g., the bottom electrodes 378*a*, formed in the cell region 100*a*. The bottom electrodes 378 in the cell region 100*a* include the bottom electrodes 378*a* with a symmetrical structure and bottom electrodes 378*c* with an asymmetrical structure so as to facilitate the subsequent deposition process. In this way, the process of forming the semiconductor device 20 in this embodiment is completed. The semiconductor device 20 in this embodiment can also form a dynamic random access memory device, which includes a plurality of vertically extending capacitors as storage nodes of the semiconductor device 20, and electrically connected to transistor (not shown) in the substrate 100 through storage node contacts 132.

According to the forming method of the semiconductor device 20 in the second embodiment of the present invention, the second supporting layer part 264*c* with a stepped structure is formed at the junction of the cell region 100*a* and the periphery region 100*b* so that a portion of the bottom electrodes 378 with an locally asymmetric structure, e.g., the bottom electrodes 378*c*, are only formed in the cell region 100*a*, while another portion of the bottom electrodes 378 with a symmetrical U-shaped electrode structure, e.g., the bottom electrodes 378*b*, are formed at the junction of the cell region 100*a* and the periphery region 100*b*. Under this operation, the forming method according to this embodiment of the present invention can also enlarge the space between adjacent bottom electrodes 378 in the storage area 100*a* by forming the bottom electrodes 378 with a locally asymmetric structure, e.g., the bottom electrodes 378*c*, so as to facilitate the subsequent deposition process. Furthermore, the forming method according to this embodiment of the present invention can also strengthen the structural support of the bottom electrodes 378 at the junction of the cell region 100*a* and the periphery region 100*b* by forming the supporting structure 260 with a relatively large local thickness. For example, the second supporting layer part 264*c* at the junction of the cell region 100*a* and the periphery region 100*b* is formed with a stepped structure, so that more contact area can be obtained between the capacitive dielectric layer 380, the top electrode layer 282 and the second supporting layer part 264*c* to increase the physical support. Therefore, the forming method of the semiconductor device 20 in this embodiment can effectively improve the structural reliability of the semiconductor device 20 and enhance the function and efficiency of the semiconductor device 20 even if the density of memory cells is increasing and the complexity of the process is also increasing.

In the semiconductor device 20 according to the second embodiment of the present invention, a second supporting layer part 264*c* with a relatively localized larger thickness is provided at the junction of the cell region 100*a* and the periphery region 100*b* to strengthen the structural support of the bottom electrodes 378 at the junction of the cell region 100*a* and the periphery region 100*b*. In addition, the semiconductor device 20 in this embodiment is also provided with a portion of bottom electrodes 378 with a locally asymmetric structure, e.g., the bottom electrodes 378*c*, so as to effectively enlarge the space between adjacent bottom electrodes 378 in the cell region 100*a*, and it is beneficial to the subsequent deposition process. Therefore, the semiconductor device 20 in this embodiment can maintain the structural reliability of the semiconductor device 20 and achieve the improved function and efficiency on the premise of continuously increasing the density of memory cells.

Figure 9:
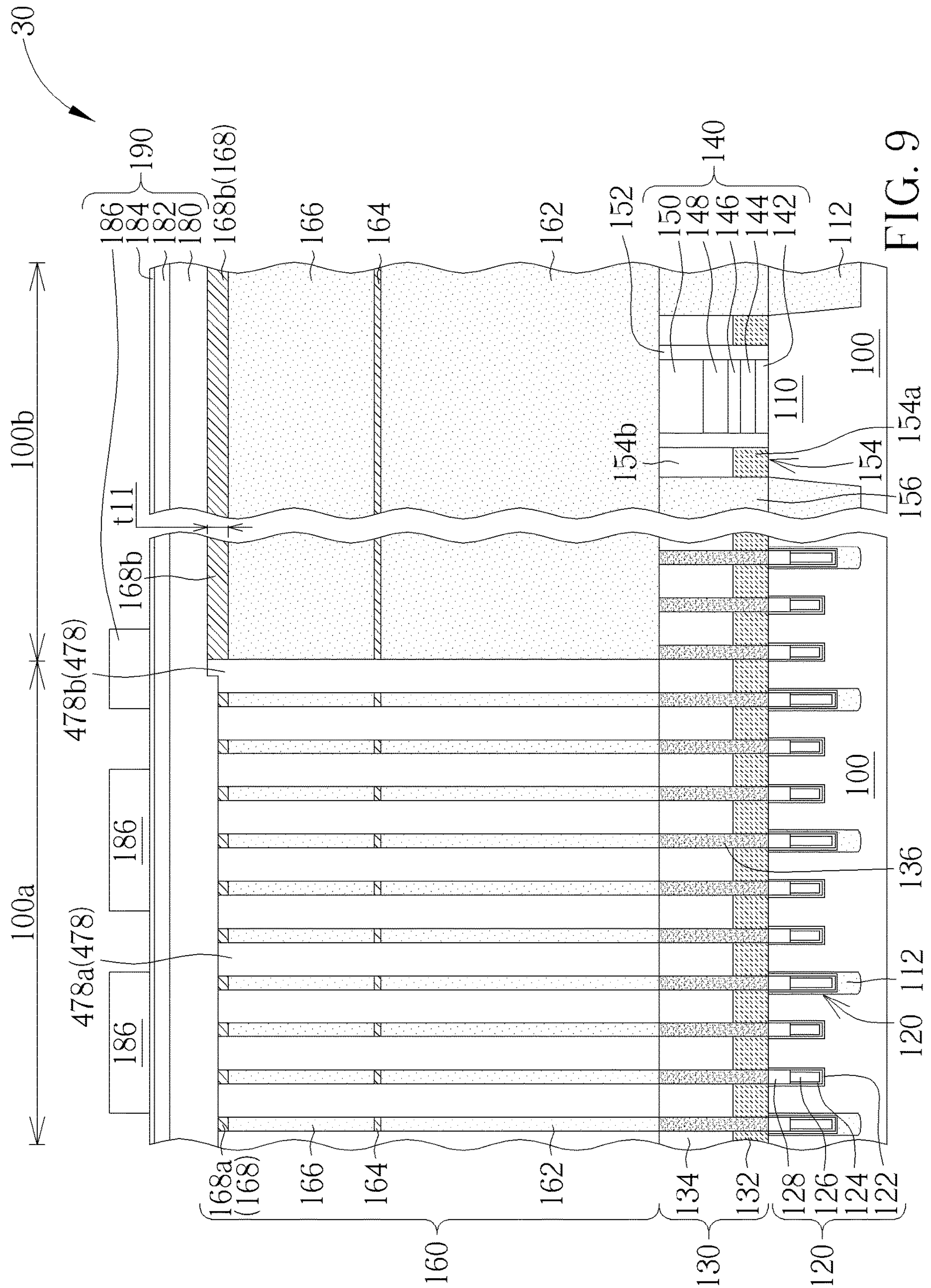
Figure 10:
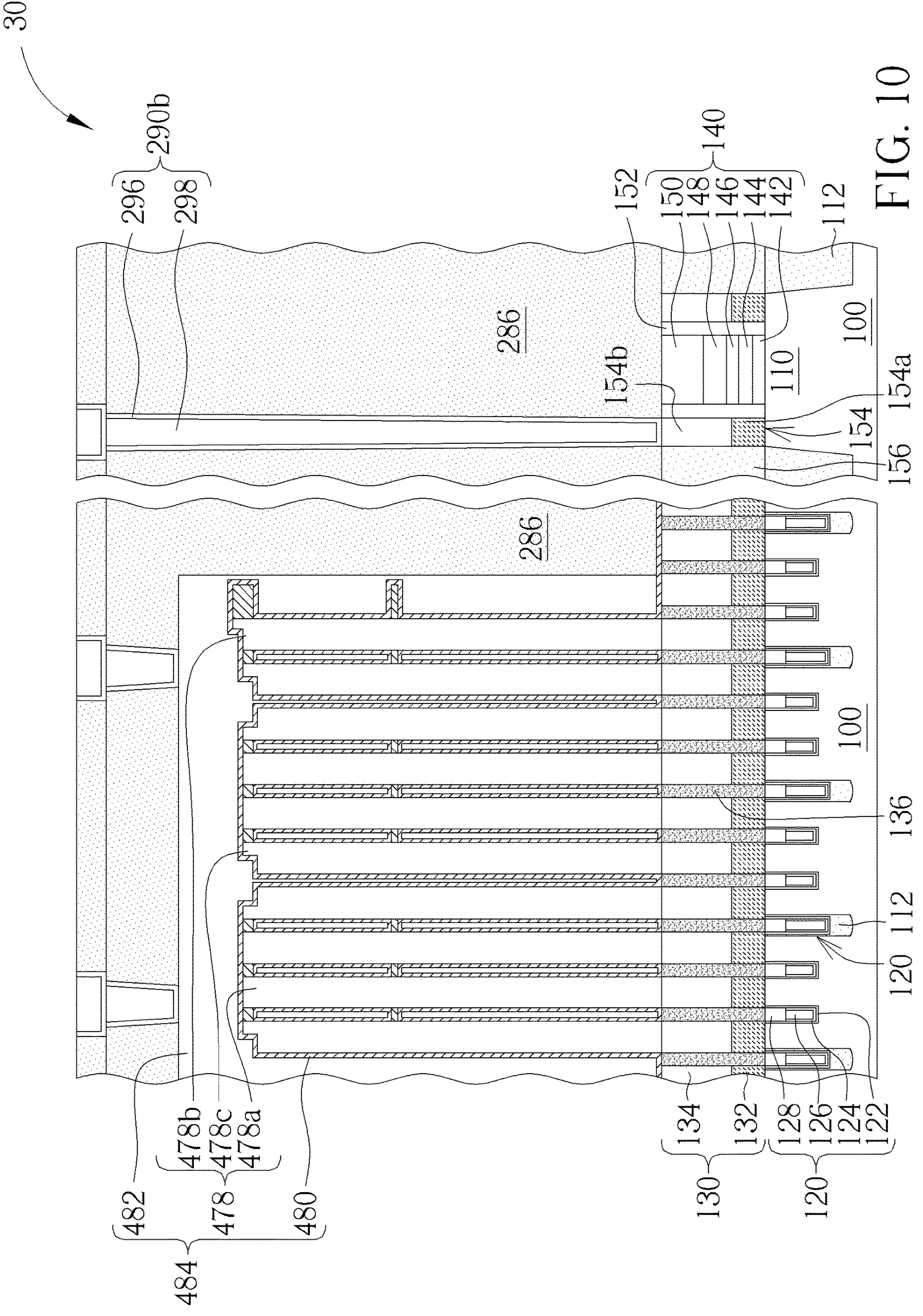

Please refer to FIG. 9 and FIG. 10, which schematically illustrate steps of the forming method of the semiconductor device 30 in a third embodiment of the present invention. The steps of forming the semiconductor device 30 in this embodiment are basically the same as those of the method of forming the semiconductor device 10 in the first embodiment, and the similarities will not be described again. The main difference between the method of forming the semiconductor device 30 in this embodiment and the method of forming the semiconductor device 10 in the first embodiment is that a plurality of columnar bottom electrodes 478 are formed in this embodiment.

In detail, as shown in FIG. 9, bottom electrodes 478 are formed in the supporting layer structure 170 by a deposition and etch-back process. The bottom electrodes 478*a* formed in the cell region 100*a* have an integrally flush top surface and are shown with a symmetrical columnar electrode structure, while the bottom electrodes 478*b* formed at the boundary between the cell region 100*a* and the periphery region 100*b* have a stepped top surface and are shown with an asymmetrical columnar electrode structure.

Subsequently, as shown in FIG. 10, proceed to the steps of the process illustrated with reference to FIG. 4 to FIG. 6 in the first embodiment. A supporting structure 260, a capacitive dielectric layer 480 and a top electrode layer 482 are formed in sequence, and a capacitor structure 484 in this embodiment is composed of bottom electrodes 478, the capacitive dielectric layer 480 and the top electrode layer 482, which are stacked in sequence. It should be noted that the second supporting layer part 264*c* formed at the junction of the cell region 100*a* and the periphery region 100*b* has a relatively large second thickness t11, so that a portion of the bottom electrodes 478 formed at the junction of the cell region 100*a* and the periphery region 100*b*, e.g., bottom electrodes 478*b*, have a stepped top surface and are shown with an asymmetrical columnar structure. On the other hand, two other portions of the bottom electrodes 478 formed in the cell region 100*a*, e.g., bottom electrodes 478*a* and 478*c*, have symmetrical and asymmetrical columnar structures, respectively, so as to facilitate the subsequent deposition process. In this way, the process of forming the semiconductor device 30 in this embodiment is completed. The semiconductor device 30 in this embodiment can also form a dynamic random access memory device, which includes a plurality of capacitors extending vertically as storage nodes of the semiconductor device 30, and electrically connected to transistor (not shown) in the substrate 100 through storage node contacts 132.

According to the forming method of the semiconductor device 30 in the third embodiment of the present invention, the supporting structure 260 with a relatively localized larger thickness is also formed at the boundary between the cell region 100*a* and the periphery region 100*b* so that when the bottom electrodes 478 are formed, the bottom electrodes 478*b* formed at the boundary between the cell region 100*a* and the periphery region 100*b* have opposite sidewalls at different levels. The sidewall of the bottom electrodes 478*b* adjacent to the periphery region 100*b* is in physical contact with the second support layer part 264*b* and has top surface at a higher level, while the sidewall of the bottom electrodes 478*b* adjacent to the cell region 100*a* has a top surface at a lower level, which is the same as the top surface of the second support layer part 264*a*. Therefore, the bottom electrodes 478*b* present an asymmetric columnar electrode structure as a whole. Under this operation, the forming method according to this embodiment of the present invention can enlarge the space between adjacent bottom electrodes 478 in the cell region 100*a* by forming the bottom electrodes 478 with a locally asymmetric structure, e.g., the bottom electrodes 478*b* and 478*c*, so as to facilitate the subsequent deposition process. In addition, the forming method according to this embodiment of the present invention can also strengthen the structural support of the bottom electrodes 478 at the junction of the cell region 100*a* and the periphery region 100*b* by forming the supporting structure 260 with a relatively large local thickness. By further covering the second support layer part 264*b* with the capacitive dielectric layer 480 formed subsequently, the contact area between the capacitive dielectric layer 480, the top electrode layer 482 and the second support layer part 264*b* is increased to enhance the physical support. Therefore, the method of forming the semiconductor device 30 in this embodiment can effectively improve the structural reliability of the semiconductor device 30 and enhance the function and efficiency of the semiconductor device 30 even if the density of memory cells is increasing and the complexity of the forming process is increasing.

In the semiconductor device 30 according to the third embodiment of the present invention, the supporting structure 260 with a relatively large local thickness is provided at the junction of the cell region 100*a* and the periphery region 100*b* to strengthen the structural support of the bottom electrodes 478 at the junction of the cell region 100*a* and the periphery region 100*b*. Furthermore, the semiconductor device 30 in this embodiment is also provided with bottom electrodes 478 with a locally asymmetric structure, e.g., bottom electrodes 478*b* and 478*c*, so as to effectively enlarge the space between adjacent bottom electrodes 478 in the cell region 100*a* and facilitate the subsequent deposition process. Therefore, the semiconductor device 30 in this embodiment can maintain the structural reliability of the semiconductor device 30 and achieve the improved function and efficiency on the premise of continuously increasing the density of memory cells.

Figure 11:
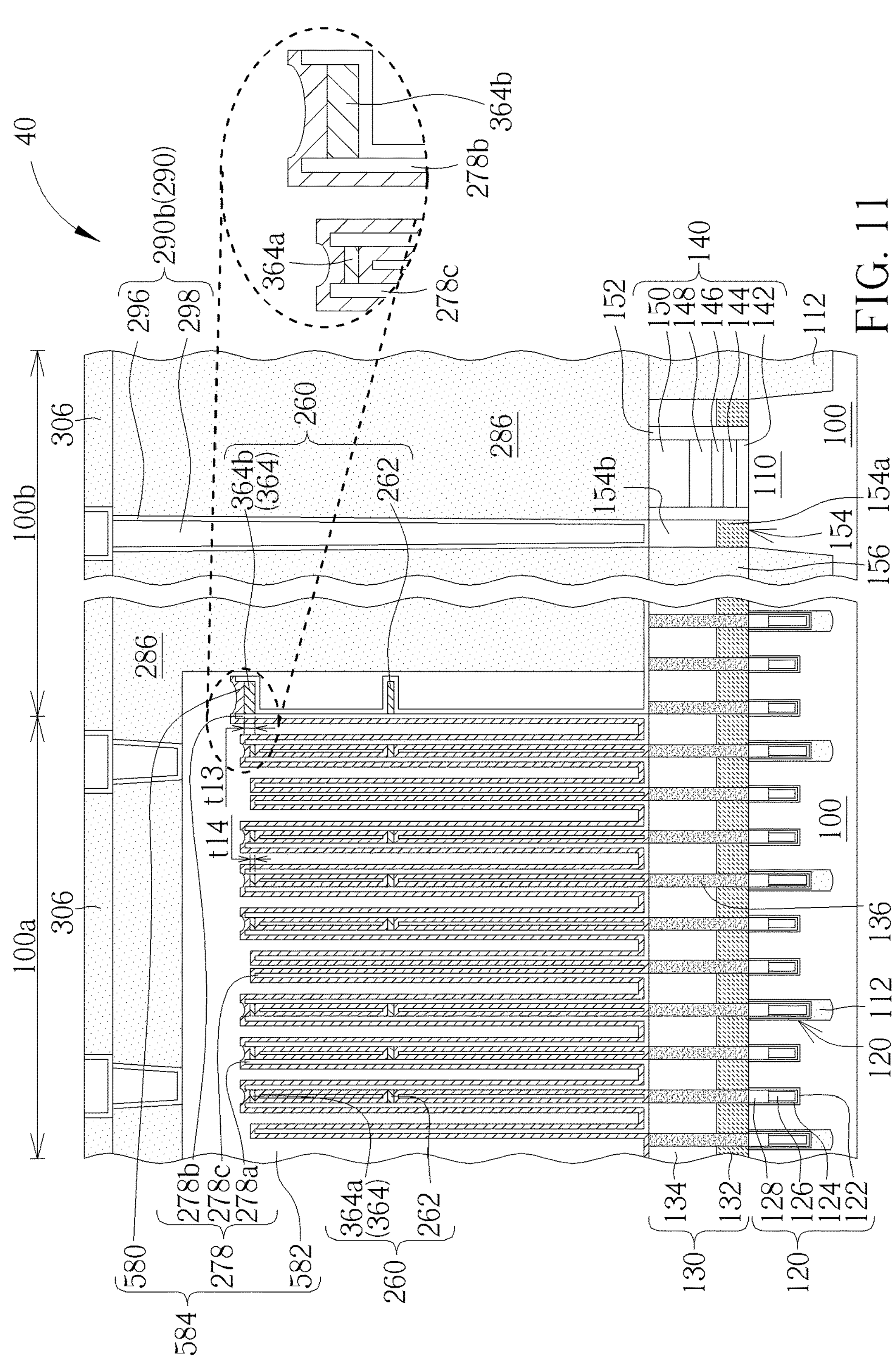
FIG. 11 is a schematic cross-sectional view of a semiconductor device according to a fourth embodiment in the present disclosure.

Please refer to FIG. 11, which shows a schematic cross-sectional view of a semiconductor device 40 in a fourth embodiment of the present invention. The structure of the semiconductor device 40 in this embodiment is basically the same as that of the semiconductor device 10 in the first embodiment, and the similarities will not be described again. The main difference between the semiconductor device 40 in this embodiment and the semiconductor device 10 in the first embodiment is that the etching selection is controlled to partially consume the remaining fourth supporting material layer part 168*a* during the second dry etching process and/or the second wet etching process, or the etching selection ratio between the electrode material layer and the fourth supporting material layer 168 is adjusted to reduce the remaining fourth supporting material layer part 168*a* when forming the bottom electrode layer 178 as shown in FIG. 4, thereby lowering levels of the remaining fourth supporting material layer parts 168*a* and 168*b* to be lower than the top surface of the bottom electrodes 278*a*.

In detail, as shown in FIG. 11, a second supporting layer 364*a* disposed in the cell region 100*a* has a smaller first thickness t14 and a top surface at a lower level than that of the bottom electrodes 278*a* disposed in the cell region 100*a*. On the other hand, a second supporting layer 364*b* disposed in the periphery region 100*b* has a second thickness t13 which is larger than the first thickness t1. A topmost surface of the second supporting layer 364*b* is higher than that of the second support layer 364*a* and lower than that of the bottom electrodes 278*b* disposed at the junction of the cell region 100*a* and the periphery region 100*b*, while a bottom surface thereof is coplanar with that of the second supporting layer 364*a*. Then, a capacitive dielectric layer 580 and a top electrode layer 582 are formed, and a capacitor structure 584 in this embodiment is composed of the bottom electrode 278, the capacitor dielectric layer 580 and the top electrode layer 582 stacked in sequence. It should be noted that the capacitive dielectric layer 580 formed subsequently will further cover the second supporting layer 364*b* so that the sidewalls and a top surface of the second supporting layer 364*b* are in physical contact the bottom electrodes 278*b* and the capacitor dielectric layer 580, respectively, to improve the structural support of the second supporting layer part 364*b* to the bottom electrodes 278*b*. Although it is not depicted in the drawings that the second supporting layer 364*b* disposed between the cell region 100*a* and the periphery region 100*b* in this embodiment can take on other forms, it should be easily understood by those of ordinary skill in the art that the second supporting layer 364*b* can also take on a stepped structure as the second support layer part 264*c* shown in FIG. 8, but it is not limited to thereto.

Therefore, the semiconductor device 40 in this embodiment can also form a dynamic random access memory device, which includes a plurality of capacitors extending vertically as storage nodes of the semiconductor device 40 and electrically connected to transistor components (not shown) in the substrate 100 through the storage node contacts 132.

In the semiconductor device 40 according to the fourth embodiment of the present invention, a supporting structure 260 with a relatively large local thickness is arranged at the junction of the cell region 100*a* and the periphery region 100*b* to strengthen the structural support of the bottom electrodes 278 at the junction of the cell region 100*a* and the periphery region 100*b*. Furthermore, the semiconductor device 40 in this embodiment is also provided with a portion of bottom electrodes 278 with a locally asymmetric structure, e.g., bottom electrodes 278*b* and 278*c*, so as to effectively enlarge the space between adjacent bottom electrodes 278 in the cell region 100*a* and facilitate the subsequent deposition process. Therefore, the semiconductor device 40 in this embodiment can maintain the structural reliability of the semiconductor device 40 and achieve the improved function and efficiency on the premise of continuously increasing the density of memory cells.

To sum up, in the semiconductor device and the forming method thereof according to the present invention, a supporting structure with a relatively large local thickness is formed between the cell region and the periphery region to improve the structural support provided by the supporting structure to the capacitor structure. Meanwhile, the bottom electrodes to be formed have a locally asymmetric structure accordingly, thereby enlarging the space between adjacent bottom electrodes in the cell region, which is beneficial to the subsequent deposition process. Therefore, the semiconductor device according to the present invention can maintain the structural reliability of the semiconductor device on the premise that the density of memory cells is continuously raised, and achieve the improved function and efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate comprising a cell region and a periphery region;

a plurality of storage node pads disposed on the substrate and located in the cell region;

a capacitor structure disposed on the plurality of storage node pads and comprising a plurality of bottom electrodes, a capacitor dielectric layer and a top electrode layer stacked in sequence, the plurality of bottom electrodes in contact with the plurality of storage node pads, respectively;

a supporting structure disposed on the plurality of storage node pads and interleaved among the plurality of bottom electrodes while being in physical contact with the plurality of bottom electrodes, the supporting structure comprising a first supporting layer and a second supporting layer sequentially from bottom to top, wherein the second supporting layer comprises a first portion having a first thickness, and a stepped portion partially having the first thickness and partially a second thickness, the stepped portion where has the first thickness is leveled with the first portion, and where has the second thickness is higher than the first portion, and the second thickness is greater than the first thickness, and wherein the first portion is disposed in the cell region and the stepped portion is disposed between the cell region and the periphery region;

an interlayer dielectric layer, disposed on the capacitor structure, overlaying the top electrode layer; and a plug, disposed in the interlayer dielectric layer and electrically connected to the capacitor structure.

2. The semiconductor device according to claim 1, wherein a top surface of the second supporting layer with the first thickness is coplanar with a top surface of the plurality of bottom electrodes.

3. The semiconductor device according to claim 2, wherein a bottom surface of the stepped portion is coplanar with a bottom surface of the first portion.

4. The semiconductor device according to claim 2, wherein sidewalls of the stepped portion is in contact with both the capacitive dielectric layer and one of the plurality of bottom electrodes.

5. The semiconductor device according to claim 4, wherein the sidewalls of the stepped portion has a side close to the cell region and an opposite side away from the cell region, and the side of the sidewalls close to the cell region is in physical contact with the one of the plurality of bottom electrodes, while the opposite side of the sidewalls away from the cell region is in physical contact with the capacitive dielectric layer.

6. The semiconductor device according to claim 1, wherein a level of the second supporting layer with the second thickness relative to the substrate is greater than a level of the second supporting layer with the first thickness relative to the substrate.

7. The semiconductor device according to claim 1, wherein a topmost surface of the stepped portion is coplanar with a top surface of one of the plurality of bottom electrodes, and a top surface of the first portion is lower than the top surface of the one of the plurality of bottom electrodes.

8. The semiconductor device according to claim 7, wherein a bottom surface of the stepped portion is coplanar with a bottom surface of the first portion.

9. The semiconductor device according to claim 1, wherein the capacitive dielectric layer are in physical contact with both sides of sidewalls of the second supporting layer with the second thickness.

10. The semiconductor device according to claim 1, wherein each of the plurality of bottom electrodes comprises a U-shaped electrode structure or a columnar electrode structure.

11. A semiconductor device, comprising:

a substrate comprising a cell region and a periphery region;

a plurality of storage node pads disposed on the substrate and located in the cell region;

a capacitor structure disposed on the plurality of storage node pads and comprising a plurality of bottom electrodes, in contact with the plurality of storage node pads, respectively; and a supporting structure disposed on the plurality of storage node pads and interleaved among the plurality of bottom electrodes while being in physical contact with the plurality of bottom electrodes, the supporting structure comprising a first supporting layer and a second supporting layer sequentially from bottom to top, wherein the second supporting layer comprises a first thickness and a second thickness and the second thickness is greater than the first thickness, and wherein the second supporting layer having the first thickness is disposed in the cell region and the second supporting layer having the second thickness is disposed between the cell region and the periphery region;

wherein a top surface of the second supporting layer having the first thickness, and a top surface of the second supporting layer having the second thickness are respectively lower than a top surface of a corresponding one of the plurality of bottom electrodes.

12. The semiconductor device according to claim 11, wherein a bottom surface of the second supporting layer having the second thickness is coplanar with a bottom surface of the second supporting layer having the first thickness.

13. The semiconductor device according to claim 11, wherein the capacitor structure further comprises a capacitive dielectric layer and a top electrode layer stacked in sequence, and sidewalls of the second supporting layer having the second thickness is in contact with both the capacitive dielectric layer and one of the plurality of bottom electrodes.

14. The semiconductor device according to claim 13, wherein the sidewalls of the second supporting layer having the second thickness has a side close to the cell region and an opposite side away from the cell region, and the side of the sidewalls close to the cell region is in physical contact with the one of the plurality of bottom electrodes, while the opposite side of the sidewalls away from the cell region is in physical contact with the capacitive dielectric layer.

15. The semiconductor device according to claim 11, wherein a level of the second supporting layer having the second thickness relative to the substrate is greater than a level of the second supporting layer having the first thickness relative to the substrate.

16. The semiconductor device according to claim 11, wherein each of the plurality of bottom electrodes comprises a U-shaped electrode structure or a columnar electrode structure.

17. A semiconductor device, comprising:

a substrate comprising a cell region and a periphery region;

a plurality of storage node pads disposed on the substrate and located in the cell region;

a capacitor structure disposed on the plurality of storage node pads and comprising a plurality of bottom electrodes, in contact with the plurality of storage node pads, respectively; and a supporting structure disposed on the plurality of storage node pads and interleaved among the plurality of bottom electrodes while being in physical contact with the plurality of bottom electrodes, the supporting structure comprising a first supporting layer and a second supporting layer sequentially from bottom to top, wherein the second supporting layer comprises a first thickness and a second thickness and the second thickness is greater than the first thickness, and wherein the second supporting layer having the first thickness is disposed in the cell region and the second supporting layer having the second thickness is disposed between the cell region and the periphery region;

wherein a top surface of one of the plurality of bottom electrodes in direct contact with the second supporting layer comprising the second thickness is higher than a top surface of one of the plurality of bottom electrodes in direct contact with the second supporting layer comprising the first thickness.

18. The semiconductor device according to claim 17, wherein a bottom surface of the second supporting layer having the second thickness is coplanar with a bottom surface of the second supporting layer having the first thickness.

19. The semiconductor device according to claim 17, wherein the capacitor structure further comprises a capacitive dielectric layer and a top electrode layer stacked in sequence, and sidewalls of the second supporting layer having the second thickness is in contact with both the capacitive dielectric layer and one of the plurality of bottom electrodes.

20. The semiconductor device according to claim 19, wherein the sidewalls of the second supporting layer having the second thickness has a side close to the cell region and an opposite side away from the cell region, and the side of the sidewalls close to the cell region is in physical contact with the one of the plurality of bottom electrodes, while the opposite side of the sidewalls away from the cell region is in physical contact with the capacitive dielectric layer.

* * * * *